(12) United States Patent
Bauer et al.

(10) Patent No.: US 9,939,504 B2
(45) Date of Patent: Apr. 10, 2018

(54) METHOD AND MAGNETIC RESONANCE APPARATUS TO ACQUIRE A MAGNETIC RESONANCE DATA SET BY RADIAL SCANNING

(71) Applicant: Siemens Aktiengesellschaft, Munich (DE)

(72) Inventors: Simon Bauer, Baunach (DE); Robert Grimm, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 835 days.

(21) Appl. No.: 14/302,689

(22) Filed: Jun. 12, 2014

(65) Prior Publication Data

US 2014/0368194 A1    Dec. 18, 2014

(30) Foreign Application Priority Data

Jun. 12, 2013 (DE) .................. 10 2013 210 947

(51) Int. Cl.
*G01V 3/00* (2006.01)
*G01R 33/48* (2006.01)

(52) U.S. Cl.
CPC ..... *G01R 33/4818* (2013.01); *G01R 33/4828* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| | | | | |
|---|---|---|---|---|
| 5,892,358 A | * | 4/1999 | King | G01R 33/5615 324/307 |
| 2008/0205735 A1 | * | 8/2008 | Nielles-Vallespin | A61B 5/02007 382/131 |

(Continued)

FOREIGN PATENT DOCUMENTS

| | | |
|---|---|---|
| WO | 2008132659 A2 | 11/2008 |
| WO | WO2008132659 * | 11/2008 |
| WO | 2013159044 A1 | 10/2013 |

OTHER PUBLICATIONS

"Reduced Circular Field-of-View Imaging," Scheffler et al., Magnetic Resonance in Medicine, vol. 40 (1998), pp. 474-480.

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

Method to acquire a magnetic resonance data set of an acquisition area (5) in a subject (O) via radial scanning along a fixed number of spokes (6) respectively described by a first angle in k-space, wherein the acquisition area (5) deviates in positional space from a circular shape in a shape that can be described by the set of first angles; wherein the acquisition of the spokes (6) takes place according to an acquisition order; wherein an acquisition position of the acquisition order is associated with each first angle under consideration of a comparison data set of the fixed number of second angles (in which second angles of successive acquisition positions differ by a golden angle) such that, for a first angle of each acquisition position, the spatially adjacent first angles have the same acquisition positions as the second angles spatially adjacent to a second angle of the acquisition position.

6 Claims, 3 Drawing Sheets

(58) Field of Classification Search
USPC .......................................................... 324/309
See application file for complete search history.

(56) References Cited

U.S. PATENT DOCUMENTS

2014/0097840 A1* 4/2014 Grodzki ............. G01R 33/4816
   324/312
2015/0276909 A1* 10/2015 Kawaji .............. G01R 33/5673
   600/413

OTHER PUBLICATIONS

"An Optimal Radial Profile Order Based on the Golden Ratio for Time-Resolved MRI," Winkelmann et al., IEEE Transactions on Medical Imaging, vol. 26, No. 1 (2007), pp. 68-76.
"Anisotropic Field-of-Views in Radial Imaging," Larson et al., IEEE Transactions on Medical Imaging, vol. 27, No. 1 (2008), pp. 47-57.
"Motion Corrected Compressed Sensing for Free-Breathing Dynamic Cardiac MRI," Usman et al., Magnetic Resonance in Medicine, vol. 70 (2013), pp. 504-516.

* cited by examiner

METHOD AND MAGNETIC RESONANCE APPARATUS TO ACQUIRE A MAGNETIC RESONANCE DATA SET BY RADIAL SCANNING

BACKGROUND OF THE INVENTION

Field of the Invention

The invention concerns a method to acquire a magnetic resonance data set of an acquisition area in a subject by radial scanning (data entry) along a fixed number of spokes in k-space, the spokes respectively being described by an angle, wherein the acquisition area in the spatial domain deviates from a circle in a shape that can be described by the set of angles.

In addition, the invention concerns a magnetic resonance apparatus for implementing such a method.

Description of the Prior Art

Image acquisition methods in which a radial scanning of k-space (entry of acquired raw data at respective points in k-space) takes place are known. The scanning in the image plane takes place along spokes of a defined angle proceeding through the k-space center. If equally distributed spokes are used over the entire angle interval of 360°, a circular acquisition area results in the spatial domain in the image plane. In an article by K. Scheffler et al., "Reduced Circular Field-of-View Imaging", MRM 40:474-480 (1998) it was shown that non-constant spoke density functions allow the definitions of non-circular acquisition areas over the angles. Further aspects are discussed in this context to an article by P. Larson et al., "Isotropic Field-of-Views in Radial Imaging", IEEE TMI 27(1), Page 47-57, 2008.

If radial scanning is used for subjects with non-circular dimensions, given undersampling markedly more severe undersampling occurs in the direction of the larger dimension of the subject. With knowledge of the cited articles, this can be compensated by adaptation of the spokes to the subject dimension. As mentioned, this shape of the acquisition area in the spatial domain that deviates from a circle can be described just as well by a non-constant, angle-dependent spoke density in k-space as by the angles of spokes given a fixed number of spokes.

If dynamic processes in the acquisition area are to be detected, it has been proposed, for example, in an article by Stefanie Winkelmann et al., "An Optimal Radial Profile Order Based on the Golden Ratio for Time-Resolved MRI", IEEE TMI 26 (1), Page 68-76, 2007, to use a trajectory based on the golden angle for the radial scanning. The angles thus are not measured in their spatial order; rather, an acquisition position is respectively associated with the individual spokes in an acquisition order, wherein the angles of successive spokes to be acquired are differentiated by a golden angle, wherein the golden ratio of 180° is preferably used which lies at 111.25°, for example. In this regard, in the cited article it was established that such a trajectory based on the golden angle is provided for every arbitrary subset of successive spokes, results in nearly an equal distribution of the spokes. An exactly equal distribution results if the fixed number of spokes is a Fibonacci number. For example, after the measurement this enables time intervals to be defined so that a tradeoff can be freely chosen between temporal and spatial resolution and subsampling artifacts. Such a trajectory based on the golden angle also allows subsets of the acquired spokes to be combined arbitrarily. However, such a trajectory based on the golden angle is only reasonably conceivable for circular acquisition areas (fields of view); for non-circular acquisition areas, a constant angle increment no longer delivers these desired properties.

SUMMARY OF THE INVENTION

An object of the invention is, even for non-circular acquisition areas, to allow angles of successive spokes to be selected in radial scanning so that an optimally uniform scanning is present even in subsets of successive spokes.

This object is achieved in accordance with the invention by a method of the aforementioned type, but wherein it is provided according to the invention that the acquisition of the spokes takes place according to an acquisition order, and wherein an acquisition position of the acquisition order is associated with each first angle under consideration of a comparison data set of the fixed number of second angles (in which second angles of successive acquisition positions differ by a golden angle), such that—for a first angle of each acquisition position—the spatially adjacent first angles have the same acquisition positions as the spatially adjacent second angles of the of the acquisition position.

The present invention thus also achieves a relatively uniform scanning in intervals of successive spokes—even when the distribution of the spokes over the angles is no longer uniform, as long as the acquisition order (in particular the proximity relationship of the acquisition order) is maintained by a trajectory using the golden ratio. A determination of first angles as a type of variation problem can take place, based on the comparison data set, such that an angle-dependent target density of the spokes is provided in k-space that describes the desired acquisition area. It is also (alternatively) possible to select arbitrary first angles that describe the desired acquisition area to which the acquisition order of the comparison data set is then transferred, wherein the latter variant is preferred according to the invention. In this way, ultimately a combination takes place of a non-circular acquisition area with a trajectory based on a golden angle, such that the acquisition can be accelerated and undersampling artifacts are reduced. This is particularly advantageous for the acquisition of dynamic processes, since it is now enabled to already reconstruct complete magnetic resonance images using a portion of the spokes in a time interval. In an embodiment of the invention, a dynamic process is incorporated wherein spokes acquired within a respective time interval are used for reconstruction of a magnetic resonance image corresponding to the time interval. For example, it is thus possible to divide the entire acquisition time (and thus the fixed number of spokes) according to multiple time intervals in order to reconstruct a series of magnetic resonance images that are generated from spokes that are essentially equally distributed with regard to the acquisition area, and therefore are low in artifacts.

It is noted again that the large golden angle for 180° is preferably used as a golden angle. This amounts to approximately 111.246117975°. However, other reference points are naturally also conceivable, such that the use of the large golden angle of the full circle of approximately 225.5° or of the small golden angle of the full circle of approximately 137.5° is possible, for example. All of these angles are defined by the golden ratio γ (approximately 1.618. According to the prevalent designation, for a semicircle the large golden angle that was already presented above corresponds to approximately 111.25°, the small golden angle to 68.75°.

Generally speaking, successively scanned spokes can thus enclose an angle corresponding to the golden angle, with regard to the second angle. The four possibilities presented above exist.

As mentioned, there are two fundamental approaches in order to ultimately determine the first angles and their acquisition order.

In a preferred first embodiment of the present invention, the predetermined first angles and the second angles are sorted according to their size, wherein the acquisition position of a second angle is respectively transferred to the first angle that coincides in terms of the ordering by size. In this embodiment, it is consequently only necessary to determine as input data the fixed number of first angles so that the desired acquisition area is imaged, which is already fundamentally known in the prior art (see in this regard the articles by K. Scheffler et al. and P. Larson et al. that have already been cited). If such first angles exist, the invention proposes an extremely simply realized way to determine in which order these first angles are used (meaning that the spokes associated with them are scanned). If the first angles $a_1$ through $a_N$ that are already sorted by size are designated as an input data set (wherein N is a fixed number), accordingly only N second angles (or, respectively, corresponding spokes) are to be generated in the interval of the golden angle, wherein then an acquisition position is naturally to be associated with each of these second angles $g_i$ (with i=1, N). These second angles of the comparison data set are now likewise sorted by their size so that—if $g_1$ is the smallest angle, $g_N$ is the largest angle—a set of second angles $g_i$ through $g_N$ is obtained with which an acquisition position $r_i$ is respectively associated. Given a trajectory based on the golden angle, the spoke described by the second angle $g_i$ would consequently be scanned first at the acquisition position $r_i=1$. These acquisition positions $r_i$ are now simply transferred to the first angles which means that the acquisition positions $r_1$ through $r_N$ are applied for the first angles $a_1$ through $a_N$.

In a second, less preferred embodiment of the present invention, it can be provided that the shape of the acquisition area is described by an angle-dependent target density of the spokes, and a second angle located at a defined acquisition position of the acquisition order has two spatially adjacent second angles acquire at defined other positions of the acquisition order, whereupon first angles are determined from the second angles while maintaining the acquisition order, and a second angle located at a defined acquisition position of the acquisition order has, as a proximity relationship, two spatially adjacent second angles acquired at defined other positions of the acquisition order, whereupon first angles are determined from the second angles while maintaining the acquisition order and the proximity relationship so that the target density is provided by the spokes acquired according to the first angle. This embodiment consequently deals with a variation problem in which one starts from the comparison data set and ultimately "rotates" the spokes while maintaining their acquisition order so that the resulting spoke density corresponds to the target density. A predetermined trajectory (the comparison data set) based on the golden angle is consequently adapted to a non-circular acquisition area.

It can thereby be concretely provided that a variation function of the second angles is determined, which supplies the first angle. A variation function is consequently used that converts the second angles into the first angles. This function for the conversion of the angles is determined under the assumptions that the number of spokes (thus the fixed number) is maintained, and the first angles that are obtained result in the target density of the spokes.

A few basic assumptions can be used so that—for example when two target expansions of the acquisition region that correspond to a target density in the angles corresponding to the directions are defined in at least two orthogonal directions of the subject to be acquired in the plane of the radial acquisition—the course of the target density between the directions is assumed to be linear with the angle. One possible assumption is thus a linear behavior of the spoke density between 0° and 90°, and naturally also of the subsequent angle intervals. In this embodiment it is advantageous if, given determination of a variation function, this is parameterized via a ratio of the target expansions or target densities.

It can also be advantageous if an original density that is assumed to be constant over the entire angle range is assumed in the determination of the first angle, wherein the fixed number of spokes to be acquired is in particular a Fibonacci number. The original spoke density (as it resulted via the comparison data set) is thus assumed to be uniform, which is satisfied approximately for an angle distribution with constant angle increment by a golden angle or is satisfied entirely when the fixed number is a Fibonacci number.

Such assumptions thus enable the variation problem to be solved and the comparison data set to be modified so that suitable first angles are obtained with the associated acquisition order. Since more complex calculations are required for this, as presented the first embodiment of the invention is preferred according to the invention, which first embodiment simply transfers the acquisition order of the trajectory based on the golden angle to the non-circular acquisition area.

In both embodiments, the methods are preferably implemented automatically by a control device of the magnetic resonance device which then controls the acquisition correspondingly according to the first angles and the acquisition order.

In addition to the method, the invention also concerns a magnetic resonance device that has a control device designed to implement the method according to the invention. All statements with regard to the method according to the invention can analogously be transferred to the magnetic resonance device according to the invention, with which the advantages of the present invention can consequently be achieved.

DESCRIPTION OF THE PREFERRED EMBODIMENTS

Figure 1:
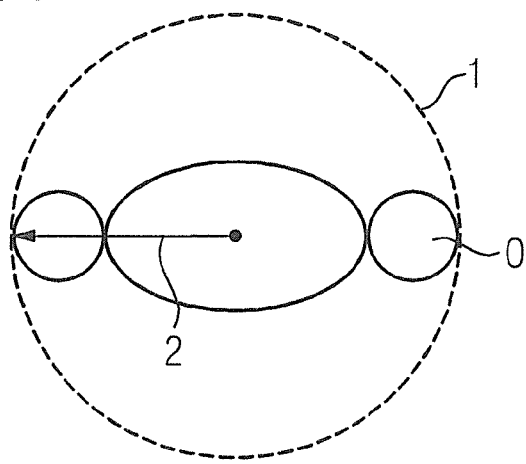
FIG. 1 shows an example of a circular acquisition area in relation to a subject to be acquired.

The method described in detail here concerns the use of the advantages of a trajectory (based on the golden angle) of the radial scan in magnetic resonance devices, even given non-circular acquisition areas. Trajectories based on the golden angle—here the major angle for a semicircle, namely 111.25°—are already known in the prior art and inevitably describe a circular acquisition area 1 in the image plane of the radial scan, as is shown in FIG. 1 in relation to a subject O. Here the acquisition area 1 has clearly already been selected so that it encompasses the entire subject O. This now leads on the one hand to the situation that a large area is acquired that is not associated at all with the subject O; however, on the other hand the problem also occurs that, given undersampling, it leads to markedly more severe undersampling in the direction of the larger dimension of the subject (thus here the direction 2).

Figure 2:
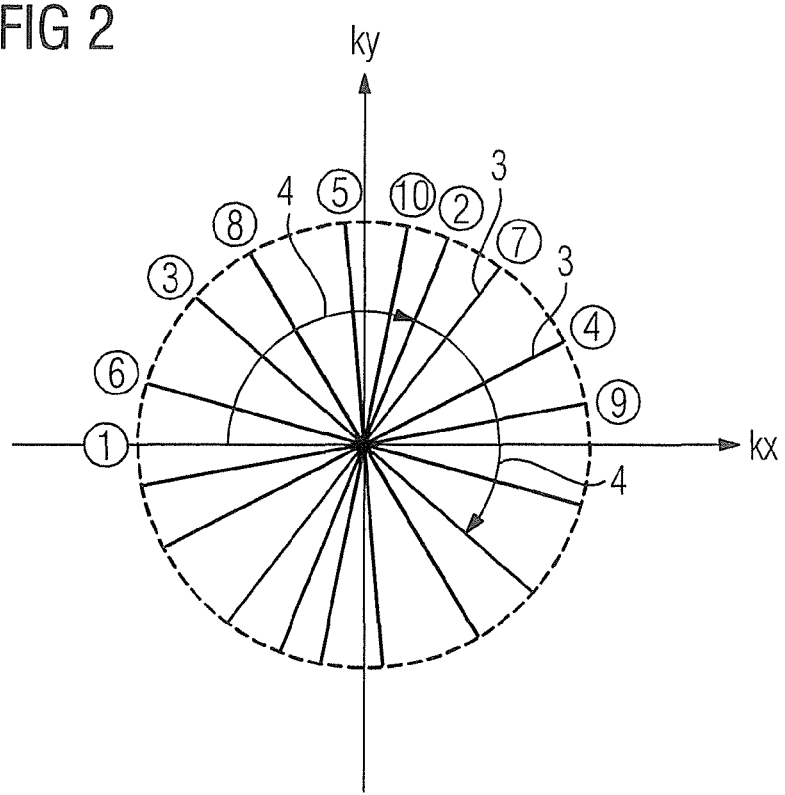
FIG. 2 shows an arrangement of spokes in k-space, which arrangement is associated with the acquisition area according to FIG. 1.

The attitude of the corresponding spokes in k-space is shown in FIG. 2, wherein a fixed number N of respective spokes 3 (characterized by a second angle) is used, which spokes 3 uniformly cover the entirety of k-space at least when N is a Fibonacci number. N=10 was chosen for the sake of a simpler presentation; however, markedly more spokes 3 are measured in the practical use case. The encircled numbers at the spokes 3 indicate their acquisition position in the acquisition order. A trajectory based on a golden angle is now characterized in that the angle increment 4 between spokes of successive acquisition position (indicated for the acquisition positions (1), (2) and (3) in FIG. 2, for example) corresponds to a golden angle, here to the major golden angle of the semicircle (thus approximately) 111.25°. If a first second angle to be measured which describes the spoke 3 of the first acquisition position is provided, a set of second angles a, with which an acquisition position is respectively associate follows for the fixed angle N. If the second angles $a_i$ are ordered according to their size, tuples $(a_i, r_1)$-$(a_N, r_N)$ consequently result in order of size, which tuples can be used in the method according to the invention, as will presently be explained. In particular, a defined proximity relationship thereby results. For example, the second angles $a_{10}$, $a_2$ and $a_7$ follow one another in order of size (as indicated in FIG. 2), such that consequently the spoke 3 that is acquired at the tenth acquisition position on the one hand and the spoke 3 that is acquired at the seventh position are adjacent to the spoke 3 that is acquired at the second acquisition position.

Figure 3:
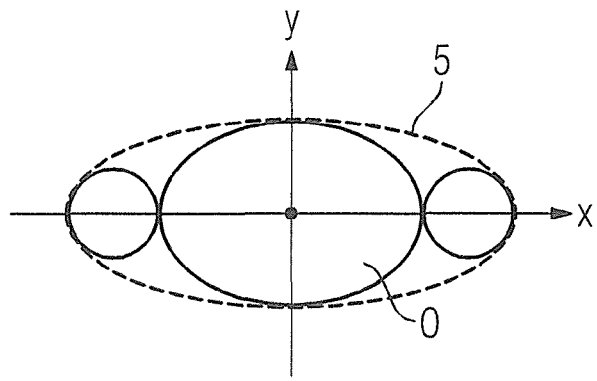
FIG. 3 shows a non-circular (ellipsoid) acquisition area in relation to the subject.

FIG. 3 now shows a different selected acquisition area 5 that deviates from a circular shape and more narrowly encloses the subject O. For such a shape of an acquisition area 5 that deviates from a circular shape it is known (see the articles cited above by K. Scheffler et al. and P. Larson et al.) how spokes—and accordingly the first angles $g_1$ describing the angle position of the spokes—can be determined. N spokes are thereby again considered, N=10 in the simplified example used here for presentation.

Figure 4:
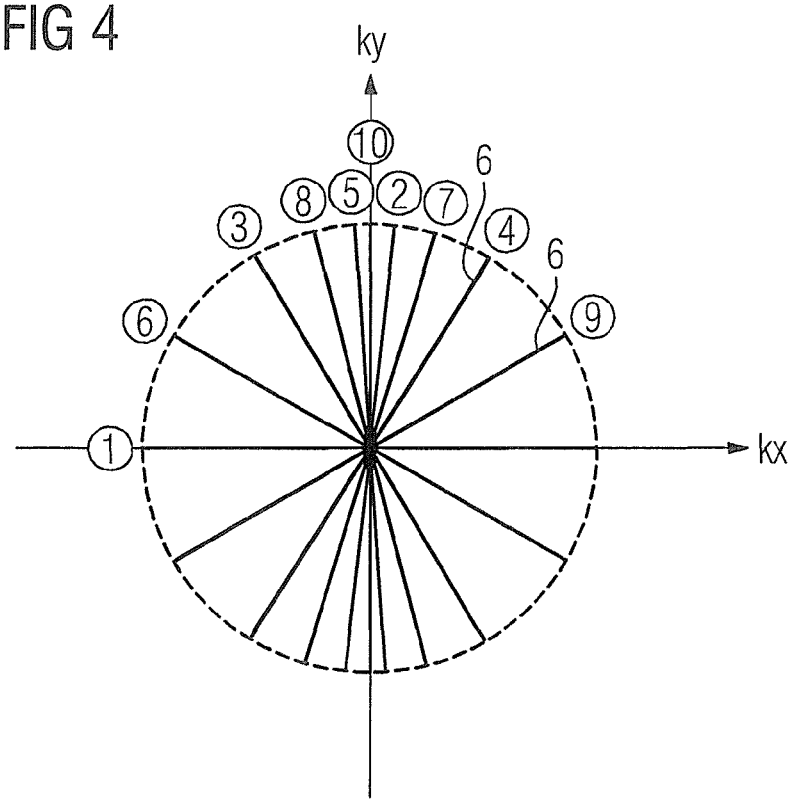
FIG. 4 shows the distribution of spokes in k-space, which distribution is associated with the acquisition area from FIG. 3.

This is presented in more detail in k-space in FIG. 4, where different spokes that are defined by the first angles (which describe the acquisition area 5 in the image plane) are rendered, wherein here as well only ten spokes 6 are shown for the sake of clarity. In contrast to the case of the acquisition area 1, the spoke density is now no longer homogeneous, but rather is smaller along the x-direction—thus the largest dimension of the acquisition area 5 (major axis of the ellipse)—than in the y-direction (minor axis of the ellipse) of the acquisition area 5.

In the exemplary embodiment presented here, the method according to the invention now serves to associate acquisition positions with the first angles $g_1$ through $g_N$ (which should again be sorted by size and can be determined from the shape of the acquisition area) in an acquisition order such that—in spite of the non-circular acquisition area 5—an optimally uniform scan is achieved, similar to as with a trajectory based on the golden angle. After the second angles $a_1$—$a_N$ with their acquisition positions $r_1$-$r_N$ are sorted by size, and this also applies to the first angles $g_1$-$g_N$, a control device of the magnetic resonance device now associates the acquisition positions $r_i$ with each first angle $g_1$. An acquisition order of the first angles consequently results that is used in order to scan the spokes 6 defined by the first angles $g_1$ in k-space (consequently to acquire magnetic resonance data).

As can be seen from FIG. 4, the effect of the described procedure is that the proximity relationship is maintained, which means that the spoke 6 to be acquired at the tenth acquisition position and the spoke 6 to be acquired at the seventh acquisition position are still adjacent to the spoke 6 to be acquired at the second acquisition position. It turns out that an optimally uniform scan of k-space is thus possible in spite of the acquisition area 5 deviating from a circular shape, which is in particular reasonable given the acquisition of dynamic processes. Respective spokes 6 acquired within a time interval (consequently magnetic resonance data acquired in the scanning of the spokes 6) can then be used to reconstruct a magnetic resonance image corresponding to the time interval, which magnetic resonance image has markedly fewer artifacts (due to the uniform scanning) than if the size order were to have been used for the acquisition order.

As an alternative to the procedure described here using the association in a size sorting, it is moreover also possible to use the approach via a target density of the spokes based on the second angles, as this was presented in the general description.

This essentially leads to the same result, wherein in particular the proximity relationship is also maintained there.

Figure 5:
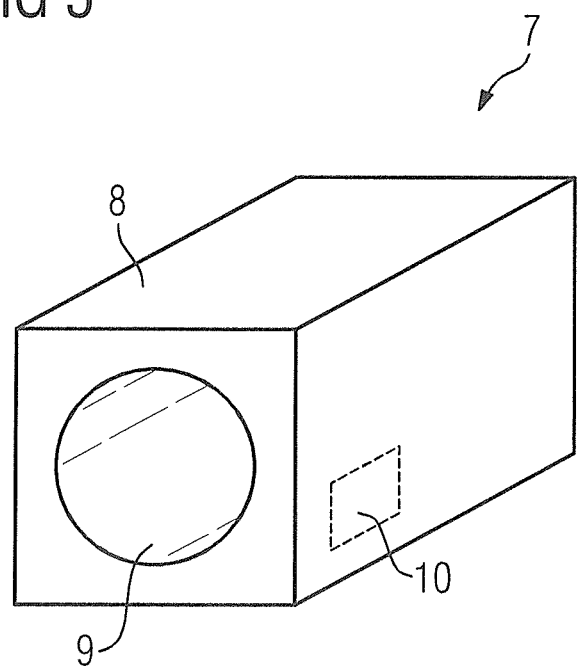
FIG. 5 schematically illustrates a magnetic resonance device according to the invention.

Finally, FIG. 5 shows a principle drawing of a magnetic resonance device 7 according to the invention that—as is basically known—has a basic magnet unit 8 with a patient receptacle 9. Surrounding the patient receptacle 9 are radio-frequency coils (in particular a body coil) and a gradient coil arrangement. This enables a radial scan of k-space to be produced with the magnetic resonance device 7, controlled by a control device 10 of the magnetic resonance device 7 along with the entire operation of the magnetic resonance device 7. The control device 10 is designed to implement the method according to the invention, which means that it can determine first angles and an acquisition order, ultimately in that the acquisition order of a trajectory based on a golden angle is impressed on the radial scan of a non-circular acquisition area 5. The described variant approach is also conceivable. The control device 10 can then control the acquisition according to the first angles and their acquisition order.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to acquire a magnetic resonance data set of an acquisition area of a subject, comprising:
   operating a magnetic resonance data acquisition unit to acquire raw magnetic resonance data from a subject situated in the magnetic resonance data acquisition unit;
   via a processor supplied with said raw magnetic resonance data, entering said raw magnetic resonance data into an electronic memory organized as k-space comprising a plurality of data entry points, by radially entering said raw magnetic resonance data along respective data points in a fixed number of spokes in k-space, with each of said spokes being described by a first angle in k-space, and wherein said acquisition area in said subject deviates from a circular shape and has a shape that is described collectively by said respective first angles;

entering said raw magnetic resonance data into respective spokes according to an acquisition order of respective positions of said spokes, said acquisition order defining said respective positions by comparison of said first angle with a data set of a fixed number of second angles for successive acquisition positions that differ by a golden angle, so as to cause, for each first angle of each acquisition position, respective spatially adjacent first angles thereto to have the same acquisition positions as the respective second angles that are spatially adjacent to the second angle of the respective acquisition position; and making the raw magnetic resonance data entered into k-space available from said electronic memory in an electronic form for reconstructing a magnetic resonance image of said acquisition area therefrom.

2. A method as claimed in claim 1 comprising, in said processor, sorting said fixed number of first angles and said fixed number of second angles according to respective sizes thereof and transferring an acquisition position of a second angle to a first angle that coincides in size order therewith.

3. A method as claimed in claim 1 wherein the shape of the acquisition area is described by an angle-dependent target density of said spokes and, in said processor, determining a proximity relationship in which a second angle situated at a defined acquisition position in said acquisition order has two spatially adjacent second angles acquired at defined other positions of said acquisition order, and determining said first angles from said second angles while maintaining said acquisition order and said proximity relationship, to produce said target density by respective spokes in which said raw magnetic resonance data are entered according to said first angle.

4. A method as claimed in claim 1 comprising, in said processor, reconstructing a magnetic resonance image from said raw magnetic resonance data entered into respective spokes within a respective time interval.

5. A method as claimed in claim 1 comprising, in said processor, using the large golden angle for 180° as said golden angle.

6. A magnetic resonance apparatus comprising:

a magnetic resonance data acquisition unit;

an electronic memory comprising a plurality of data entry points therein organized as k-space;

a control unit configured to operate the magnetic resonance data acquisition unit to acquire raw magnetic resonance data from a subject situated in the magnetic resonance data acquisition unit;

a processor supplied with said raw magnetic resonance data, said processor being configured to enter said raw magnetic resonance data into said electronic memory by radially entering said raw magnetic resonance data along respective data points in a fixed number of spokes in k-space, with each of said spokes being described by a first angle in k-space, and wherein said acquisition area in said subject deviates from a circular shape and has a shape that is described collectively by said respective first angles;

said processor being configured to enter said raw magnetic resonance data into respective spokes according to an acquisition order of respective positions of said spokes, said acquisition order defining said respective positions by comparison of said first angle with a data set of a fixed number of second angles for successive acquisition positions that differ by a golden angle, so as to cause, for each first angle of each acquisition position, respective spatially adjacent first angles thereto to have the same acquisition positions as the respective second angles that are spatially adjacent to the second angle of the respective acquisition position; and said processor being configured to make the raw magnetic resonance data entered into k-space available from said electronic memory in an electronic form for reconstructing a magnetic resonance image of said acquisition area therefrom.

* * * * *